US 6,686,697 B2

(12) United States Patent
Cho et al.

(10) Patent No.: US 6,686,697 B2
(45) Date of Patent: Feb. 3, 2004

(54) CIRCUIT TO PROTECT A LIGHT ELEMENT

(75) Inventors: Myoung-cheol Cho, Seoul (KR); Byung-ryul Ryoo, Gyeonggi-do (KR); Kyung-ui Park, Seoul (KR); Ui-yol Kim, Gyeonggi-do (KR); Pyong yong Seong, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/281,233

(22) Filed: Oct. 28, 2002

(65) Prior Publication Data

US 2003/0107324 A1 Jun. 12, 2003

(30) Foreign Application Priority Data

Dec. 7, 2001 (KR) .......................................... 2001-77419

(51) Int. Cl.$^7$ ............................................... H05B 41/36
(52) U.S. Cl. .................... 315/149; 315/159; 361/88; 372/38.03
(58) Field of Search ................ 315/149, 159; 372/38.02, 38.03, 38.07, 38.09; 250/505.1; 361/88, 91.1, 90, 92

(56) References Cited

U.S. PATENT DOCUMENTS

| 4,751,524 | A | * | 6/1988 | Balchunas | .................. 347/247 |
| 5,144,631 | A | * | 9/1992 | Okino | .......................... 372/25 |
| 6,100,907 | A | * | 8/2000 | Uffel | .......................... 347/133 |
| 6,445,670 | B1 | * | 9/2002 | Oshima | ...................... 369/116 |
| 6,504,857 | B1 | * | 1/2003 | Iwazaki | ..................... 372/38.1 |

FOREIGN PATENT DOCUMENTS

JP          9-288840         * 11/1997

\* cited by examiner

*Primary Examiner*—Don Wong
*Assistant Examiner*—Thuy Vinh Tran
(74) *Attorney, Agent, or Firm*—Staas & Halsey LLP

(57) ABSTRACT

A circuit protects a light element and prevents a breakdown of a laser diode (LD) when electric static discharge (ESD) occurs. The circuit protects the light element in a drive to control an operation of the light element, which radiates light onto a disc. Here, the drive includes a switch between an active node of the light element and a predetermined potential so that the switch is short-circuited in a normal state, but is open when the drive operates. The light element is protected from static electricity or a surge voltage in a manufacturing process thereof or under a user environment. As a result, the probability that the light element is broken down is remarkably reduced.

13 Claims, 2 Drawing Sheets

CIRCUIT TO PROTECT A LIGHT ELEMENT

CROSS REFERENCE TO RELATED APPLICATIONS

This application claims the benefit of Korean Application No. 2001-77419 filed Dec. 7, 2001, in the Korean Intellectual Property Office, the disclosure of which is incorporated herein by reference.

BACKGROUND OF THE INVENTION

1. Field of the Invention

The present invention relates to an optical recording reproducer, and more particularly, to a circuit to protect a light element to prevent a breakdown of a laser diode (LD) when electric static discharge (ESD) occurs.

2. Description of the Related Art

Widely used laser diodes (LDs), which are one of essential components of optical apparatuses, are sensitive to static electricity. Thus, steps to prevent static electricity have been taken and managed in a process of manufacturing LDs. However, it is impossible to completely prevent static electricity due to various conditions or environments. LD manufacturers have somewhat different electrostatic levels for the LDs, which are lower than an electrostatic level of about 60V, a level that is allowed in processes to manufacture the LDs.

FIG. 1 is a diagram of a conventional light element driving circuit which includes a laser diode 100 and a drive IC 101 to drive the laser diode 100. If the laser diode 100 is exposed to a surge voltage or static electricity, there is a high probability that the laser diode 100 will break down.

SUMMARY OF THE INVENTION

Various objects and advantages of the invention will be set forth in part in the description that follows and, in part, will be obvious from the description, or may be learned by practice of the invention.

To solve the above-described problems, in accordance with an embodiment of the present invention, there is provided a circuit to protect a light element exposed to static electricity to reduce a probability that the light element breaks down.

In accordance with an embodiment of the present invention, there is provided a circuit to protect a light element in a drive to control an operation of the light element which radiates light onto a disc. Here, the drive includes a switch between an active node of the light element and a predetermined potential so that the switch is short-circuited in a normal state, but is open when the drive operates.

In accordance with a second embodiment of the present invention, there is provided a circuit to protect a light element in an apparatus to control an operation of the light element which radiates light onto a disc. The circuit includes a switching unit and a light element drive. The switching unit is connected between an active node of the light element and a predetermined potential. The light element drive controls the operation of the light element and outputs a switching control signal to open the switching unit when a command to operate the light element is input from an outside.

The switching unit is short-circuited in a normal state.

In accordance with a third embodiment of the present invention, there is provided a circuit to protect a light element in an apparatus to control an operation of the light element which radiates light onto a disc. The circuit includes a switching unit and an electrostatic voltage sensor. The switching unit is connected between an active node of the light element and a predetermined potential. The electrostatic voltage sensor senses an electrostatic voltage occurring in the apparatus and outputs a switching control signal to short-circuit the switching unit when the electrostatic voltage is greater than a reference value.

These together with other aspects and advantages which will be subsequently apparent, reside in the details of construction and operation as more fully hereinafter described and claimed, reference being had to the accompanying drawings forming a part thereof, wherein like numerals refer to like parts throughout.

BRIEF DESCRIPTION OF THE DRAWINGS

These and other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Hereinafter, embodiments of the present invention will be described in detail with reference to the attached drawings. The present invention may, however, be embodied in many different forms and should not be construed as being limited to the embodiments set forth herein; rather, these embodiments are provided so that the present disclosure will be thorough and complete, and will fully convey the concept of the invention to those skilled in the art.

Figure 1:
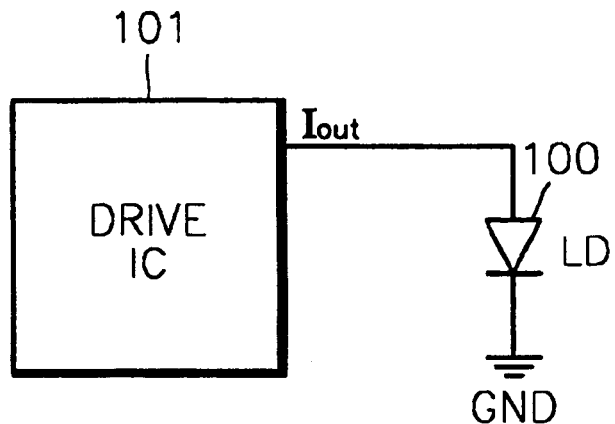
FIG. 1 is a diagram of a conventional light element driving circuit.
Figure 2:
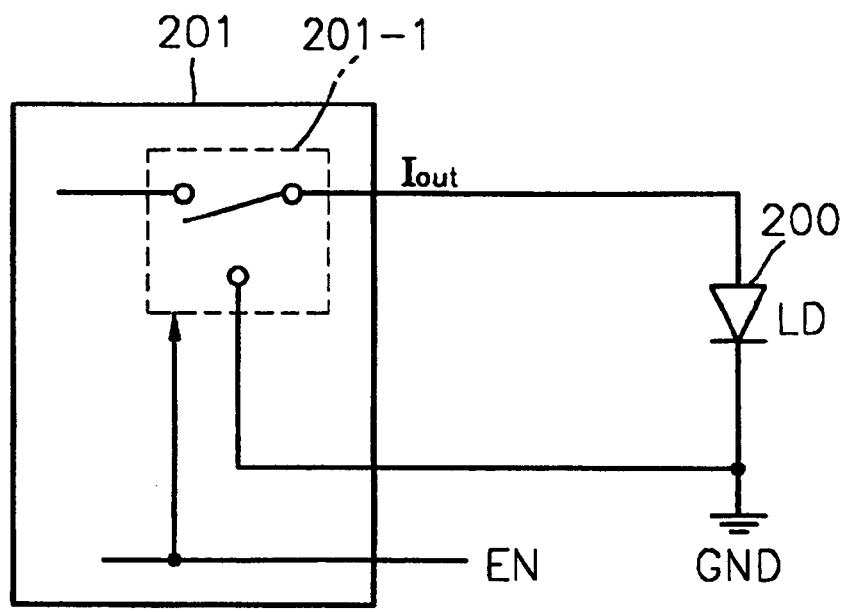
FIG. 2 is a diagram of a circuit to protect a light element, according to an embodiment of the present invention.

FIG. 2 is a diagram of a circuit to protect a light element according to an embodiment of the present invention. The circuit includes a laser diode (LD) 200, which is one of light elements, a drive IC 201 to control an operation of the LD 200, and a switch 201-1, which is included in the drive IC 201 and connected between an active node of the LD 200 and a predetermined potential or ground GND.

The switch 201-1 is short-circuited in a normal state. In other words, the LD 200 is protected from an abnormal static electricity or from a surge voltage when in a state where the active node of the LD 200 is connected to the ground GND. Here, the normal state represents a state where a general power source is not applied, or the abnormal static electricity or the surge voltage occurs.

When the drive IC 201 receives an enable EN signal to operate the LD 200, the EN signal serves as a switching control signal to open the short-circuited switch 201-1. Then, the LD 200 operates normally.

Figure 3:
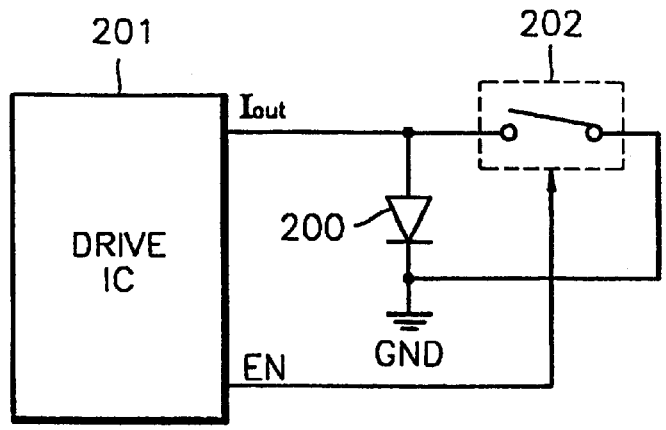
FIG. 3 is a diagram of a circuit to protect the light element, according to another embodiment of the present invention.

FIG. 3 is a diagram of a circuit to protect the light element, according to another embodiment of the present invention. The circuit includes the LD 200, the drive IC 201 to control the operation of the LD 200, and a switch 202, which is connected between the active node of the LD 200 and the ground GND.

The LD protecting circuit shown in FIG. 3 is different from that shown in FIG. 2 in that the switch 202 is positioned outside the drive IC 201. The switch 202 is short-circuited in a normal state. In other words, the LD 200 is protected from the abnormal static electricity or from the surge voltage when in the state where the active node of the LD 200 is connected to the ground GND. Here, the normal state represents a state where the general power source is not applied, or the static electricity or the surge voltage occurs.

When the drive IC 201 receives the enable EN signal to operate the LD 200, the EN signal serves as the switching control signal to open the short-circuited switch 202. Then, the LD 200 operates normally.

Figure 4:
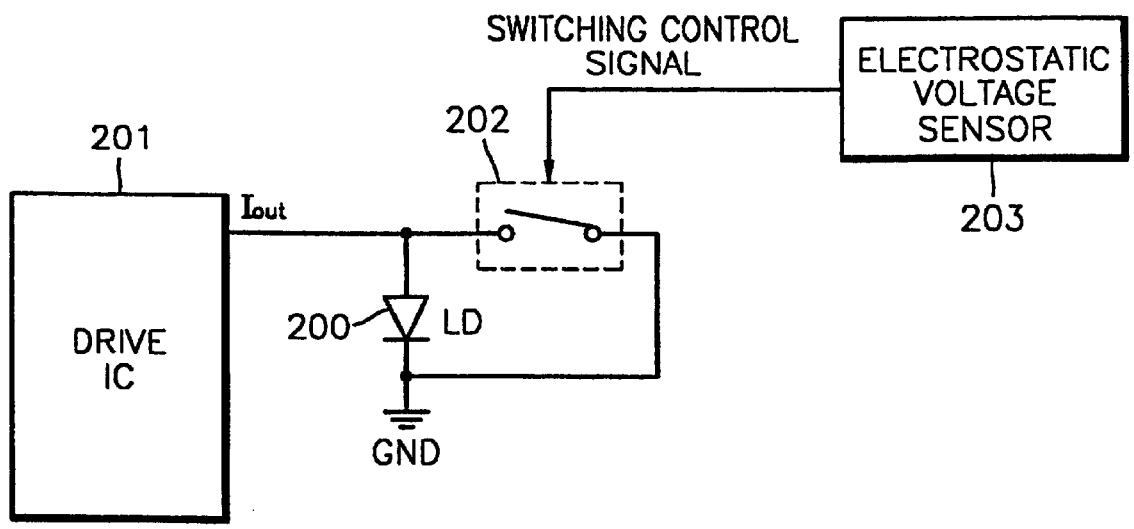
FIG. 4 is a diagram of a circuit to protect the light element, according to yet another embodiment of the present invention.

FIG. 4 is a diagram of a circuit to protect the light element, according to yet another embodiment of the present invention. The circuit includes the LD 200, the drive IC 201 to control the operation of the LD 200, the switch 202 which is included in the drive IC 201 and connected between the active node of the LD 200 and the ground GND, and an electrostatic voltage sensor 203 to sense an electrostatic voltage to output a switching control signal.

The electrostatic voltage sensor 203 senses the electrostatic voltage occurring in the circuit to output the switching control signal to open the switch 202 when the sensed electrostatic voltage is smaller than a reference value (including a normal state) or to short-circuit the switch 202 when the sensed electrostatic voltage is greater than the reference value.

The switch 202 is open when the electrostatic voltage sensed by the electrostatic voltage sensor 203 is smaller than the reference value. In other words, the LD 200 operates normally in a state where the switch 202 is open.

However, if the electrostatic voltage sensed in the electrostatic voltage sensor 203 is greater than the reference value, e.g., more than 60V, the electrostatic voltage sensor 203 outputs the switching control signal to short-circuit the switch 202. When the switch 202 is short-circuited, the active node of the LD 200 and the ground GND are short-circuited, to thereby protect the LD 200 from abnormal static electricity or the surge voltage.

As described above, according to the present invention, a light element is protected from static electricity or a surge voltage in a manufacturing process thereof or under a user environment. As a result, a probability that the light element brakes down is remarkably reduced.

The various features and advantages of the invention are apparent from the detailed specification and, thus, it is intended by the appended claims to cover such features and advantages of the invention that fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A circuit to protect a light element in a drive to control an operation of the light element which radiates light onto a disc, comprising:

a switch between an active node of the light element and a predetermined potential so that the switch is short-circuited in a normal state and open when the drive operates, wherein the drive comprises the switch, wherein the normal state represents a state where a general power source is not applied, or a static electricity or a surge voltage occurs.

2. The circuit as recited in claim 1, wherein the light element is protected from an abnormal static electricity or from the surge voltage when in a state where the active node of the light element is connected to the predetermined potential.

3. The circuit as recited in claim 1, wherein the predetermined potential comprises a ground.

4. A circuit to protect a light element in an apparatus to control an operation of the light element which radiates light onto a disc, the circuit comprising:

a switching unit connected between an active node of the light element and a predetermined potential; and a light element drive controlling the operation of the light element and outputting a switching control signal to open the switching unit when a command to operate the light element is input from an outside source, wherein the light element is protected from an abnormal static electricity or from a surge voltage when in a state where the active node of the light element is connected to the predetermined potential.

5. The circuit as recited in claim 4, wherein the switching unit is short-circuited in a normal state.

6. The circuit as recited in claim 4, wherein a normal state represents a state where a general power source is not applied, or the abnormal static electricity or the surge voltage occurs.

7. The circuit as recited in claim 4, wherein the drive receives an enable EN signal to operate the light element, where the EN signal serves as the switching control signal to open the switch.

8. The circuit as recited in claim 4, wherein the predetermined potential comprises a ground.

9. A circuit to protect a light element in an apparatus to control an operation of the light element which radiates light onto a disc, the circuit comprising:

a switching unit connected between an active node of the light element and a predetermined potential; and an electrostatic voltage sensor sensing an electrostatic voltage occurring in the apparatus and outputting a switching control signal to short-circuit the switching unit when the electrostatic voltage is greater than a reference value.

10. The circuit as recited in claim 9, wherein the electrostatic voltage sensor outputs the switching control signal to open the switching unit when the sensed electrostatic voltage is smaller than the reference value.

11. The circuit as recited in claim 9, wherein the switching unit is open when the electrostatic voltage sensed by the electrostatic voltage sensor is smaller than the reference value.

12. The circuit as recited in claim 9, wherein the light element operates normally in a state where the switching element is open.

13. The circuit as recited in claim 9, wherein the predetermined potential comprises a ground.

* * * * *